US008701061B2

(12) United States Patent
Tsukamoto

(10) Patent No.: US 8,701,061 B2
(45) Date of Patent: Apr. 15, 2014

(54) SEMICONDUCTOR DESIGN SUPPORT APPARATUS

(75) Inventor: Yasutaka Tsukamoto, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/034,971

(22) Filed: Feb. 25, 2011

(65) Prior Publication Data

US 2011/0214098 A1 Sep. 1, 2011

(30) Foreign Application Priority Data

Mar. 1, 2010 (JP) ................................ 2010-044598

(51) Int. Cl.
*G06F 9/455* (2006.01)
*G06F 17/50* (2006.01)

(52) U.S. Cl.
USPC ............................ 716/108; 716/106; 716/113

(58) Field of Classification Search
USPC ......................................................... 716/108
See application file for complete search history.

(56) References Cited

U.S. PATENT DOCUMENTS

| | | | | |
|---|---|---|---|---|
| 5,717,729 | A | * | 2/1998 | Iknaian et al. ................ 375/356 |
| 6,042,613 | A | | 3/2000 | Tsukamoto |
| 6,093,212 | A | | 7/2000 | Takahashi et al. |
| 6,094,527 | A | | 7/2000 | Tsukamoto et al. |
| 6,359,483 | B1 | * | 3/2002 | Watkins et al. ............... 327/158 |
| 6,910,202 | B2 | | 6/2005 | Minami et al. |
| 7,310,795 | B2 | | 12/2007 | Tsukamoto |
| 7,343,276 | B1 | | 3/2008 | Tsukamoto et al. |
| 2004/0068711 | A1 | * | 4/2004 | Gupta et al. .................... 716/18 |
| 2007/0208552 | A1 | * | 9/2007 | Reddy et al. .................... 703/19 |
| 2008/0201673 | A1 | | 8/2008 | Tsukamoto |
| 2009/0164957 | A1 | * | 6/2009 | Hailu et al. ....................... 716/6 |

FOREIGN PATENT DOCUMENTS

| | | |
|---|---|---|
| JP | 5-151307 | 6/1993 |
| JP | 7-49885 | 2/1995 |
| JP | 9-147005 | 6/1997 |
| JP | 10-11482 | 1/1998 |
| JP | 11-64461 | 3/1999 |
| JP | 2003-281216 | 10/2003 |
| JP | 2004-234097 | 8/2004 |
| JP | 2004-287669 | 10/2004 |
| JP | 2005-317036 | 11/2005 |
| JP | 3763700 | 1/2006 |
| JP | 2006-31208 | 2/2006 |
| JP | 2008-204111 | 9/2008 |

OTHER PUBLICATIONS

Japanese official action dated Jun. 25, 2013 in corresponding Japanese patent application No. 2010-044598.

\* cited by examiner

*Primary Examiner* — Paul Dinh
*Assistant Examiner* — Bryce Aisaka
(74) *Attorney, Agent, or Firm* — Cooper & Dunham LLP

(57) ABSTRACT

A disclosed semiconductor design support apparatus reads circuit description information and generates information required for delay adjustment. The semiconductor design support apparatus includes a logic simulation unit configured to perform logic simulation based on the circuit description information and output logic simulation result information; a latency information acquiring unit configured to acquire, from the logic simulation result information, latency information relating to signals at a signal junction, the signals being output from multiple blocks; an adjustment latency calculating unit configured to calculate, from the latency information, adjustment latency information required for the delay adjustment; and an adjustment delay information generating unit configured to generate, from the adjustment latency information, adjustment delay information required for the delay adjustment.

8 Claims, 12 Drawing Sheets

FIG.9

```
SC_MODULE(TOP)
{
...
    fifo< sc_unit<8>, DEPTH1 > FIFO1;
    fifo< sc_unit<8>, DEPTH2 > FIFO2;
...
    BLOCK_A.AOUT0(FIFO1.input);
    BLOCK_C.CIN0(FIFO1.output);
    BLOCK_B.BOUT0(FIFO2.input);
    BLOCK_C.CIN1(FIFO2.output);
...
};
```

US 8,701,061 B2

SEMICONDUCTOR DESIGN SUPPORT APPARATUS

CROSS-REFERENCE TO RELATED APPLICATIONS

This patent application is based upon and claims the benefit of priority of Japanese Patent Application No. 2010-044598 filed on Mar. 1, 2010 the entire contents of which are incorporated herein by reference.

BACKGROUND OF THE INVENTION

1. Field of the Invention

The present invention is generally directed to electronic design technologies for semiconductor products.

2. Description of the Related Art

For designing pipelined circuits, it may be required to design latency (the amount of delay) of each block to be the same among multiple blocks. The term "latency" here refers to a clock cycle number from when data reach the input of a block to when the data are transmitted to the output of the block.

Adjustment of such latency is explained with reference to FIG. 1. In FIG. 1, latency of Block A is "3" and latency of Block B is "2". That is, in Block A, a change at an input AIN0 is output from an output AOUT0 in the third clock cycle due to the interposition of registers and, therefore, the latency is "3". Combinational circuits have no effect on the latency. In a similar manner, in Block B, a change at an input BIN0 is output from an output BOUT0 in the second clock cycle and, therefore, the latency is "2".

With such pipelined circuits, in some cases, the data arrival time (clock cycle time) needs to be the same between inputs CIN0 and CIN1 of Block C in FIG. 1. In the case of FIG. 1, since the latency of Block A is "3", data arrive at the input CIN0 of Block C three clock cycles after the arrival of the data at the input AIN0 of Block A. On the other hand, since the latency of Block B is "2", data arrive at the input CIN1 of Block C two clock cycles after the arrival of the data at the input BIN0 of Block B. Assume here that the data arrive at the input AIN0 of Block A and the input BIN0 of Block B at the same time.

In such conditions, the data arrival times at the inputs CIN0 and CIN1 of Block C are conventionally set to be the same in the following manner.

First, the data arrival times at the inputs CIN0 and CIN1 of Block C are visually checked based on logic simulation results, and the difference between the data arrival times is calculated manually.

Next, if there is a difference in the data arrival times, a register (flip-flop) or registers for latency adjustment are manually inserted into circuit data. FIG. 2 shows that a register DELAY_FF has been added to Block B.

Thus in the case of calculating the difference in the data arrival times and inserting a register/registers manually, if there are many data junctions, a point or points at which the data arrival times are not the same may fail to be noticed, or the difference in the data arrival times may be incorrectly calculated. As a result, the design efficiency decreases.

In order to solve such problems, Patent Document 1 discloses a technique for, by high-level synthesis, adjusting latency among multiple threads which operate concurrently.
[Patent Document 1] Japanese Patent No. 3763700

However, because of being based on high-level synthesis, the technique disclosed in Patent Document 1 is not applicable for adjusting latency between a block designed by high-level synthesis and a block designed by existing design technology which is not high-level synthesis. Also, the disclosed technique cannot be applied to a circuit composed only of blocks designed by existing design technology which is not high-level design technology.

SUMMARY OF THE INVENTION

Accordingly, embodiments of the present invention may provide a novel and useful design apparatus solving one or more of the problems discussed above.

More specifically, the embodiments of the present invention may provide a semiconductor design support apparatus capable of applying latency adjustment also to blocks designed by existing design technology which is not high-level design technology.

One aspect of the present invention may be to provide a semiconductor design support apparatus that reads circuit description information and generates information required for delay adjustment. The semiconductor design support apparatus includes a logic simulation unit configured to perform logic simulation based on the circuit description information and output logic simulation result information; a latency information acquiring unit configured to acquire, from the logic simulation result information, latency information relating to signals at a signal junction, the signals being output from multiple blocks; an adjustment latency calculating unit configured to calculate, from the latency information, adjustment latency information required for the delay adjustment; and an adjustment delay information generating unit configured to generate, from the adjustment latency information, adjustment delay information required for the delay adjustment.

Another aspect of the present invention is a semiconductor design support control method applied to a semiconductor design support apparatus that reads circuit description information and generates information required for delay adjustment. The semiconductor design support control method includes a logic simulation step of performing logic simulation based on the circuit description information and outputting logic simulation result information; a latency information acquiring step of acquiring, from the logic simulation result information, latency information relating to signals at a signal junction, the signals being output from multiple blocks; an adjustment latency calculating step of calculating, from the latency information, adjustment latency information required for the delay adjustment; and an adjustment delay information generating step of generating, from the adjustment latency information, adjustment delay information required for the delay adjustment.

Yet another aspect of the present invention is a computer-readable storage medium storing a semiconductor design support control program for causing a computer to execute a process. The computer constitutes a semiconductor design support apparatus that reads circuit description information and generates information required for delay adjustment. The process includes a logic simulation step of performing logic simulation based on the circuit description information and outputting logic simulation result information; a latency information acquiring step of acquiring, from the logic simulation result information, latency information relating to signals at a signal junction, the signals being output from multiple blocks; an adjustment latency calculating step of calculating, from the latency information, adjustment latency information required for the delay adjustment; and an adjustment delay information generating step of generating, from the adjustment latency information, adjustment delay information required for the delay adjustment.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE DRAWINGS

FIG. 9 shows an example of a high-level circuit description in SystemC;

DETAILED DESCRIPTION OF THE PREFERRED EMBODIMENTS

A description is given below, with reference to the FIG. 3 through FIG. 12 of embodiments of the present invention.
[First Embodiment]

Figure 1:
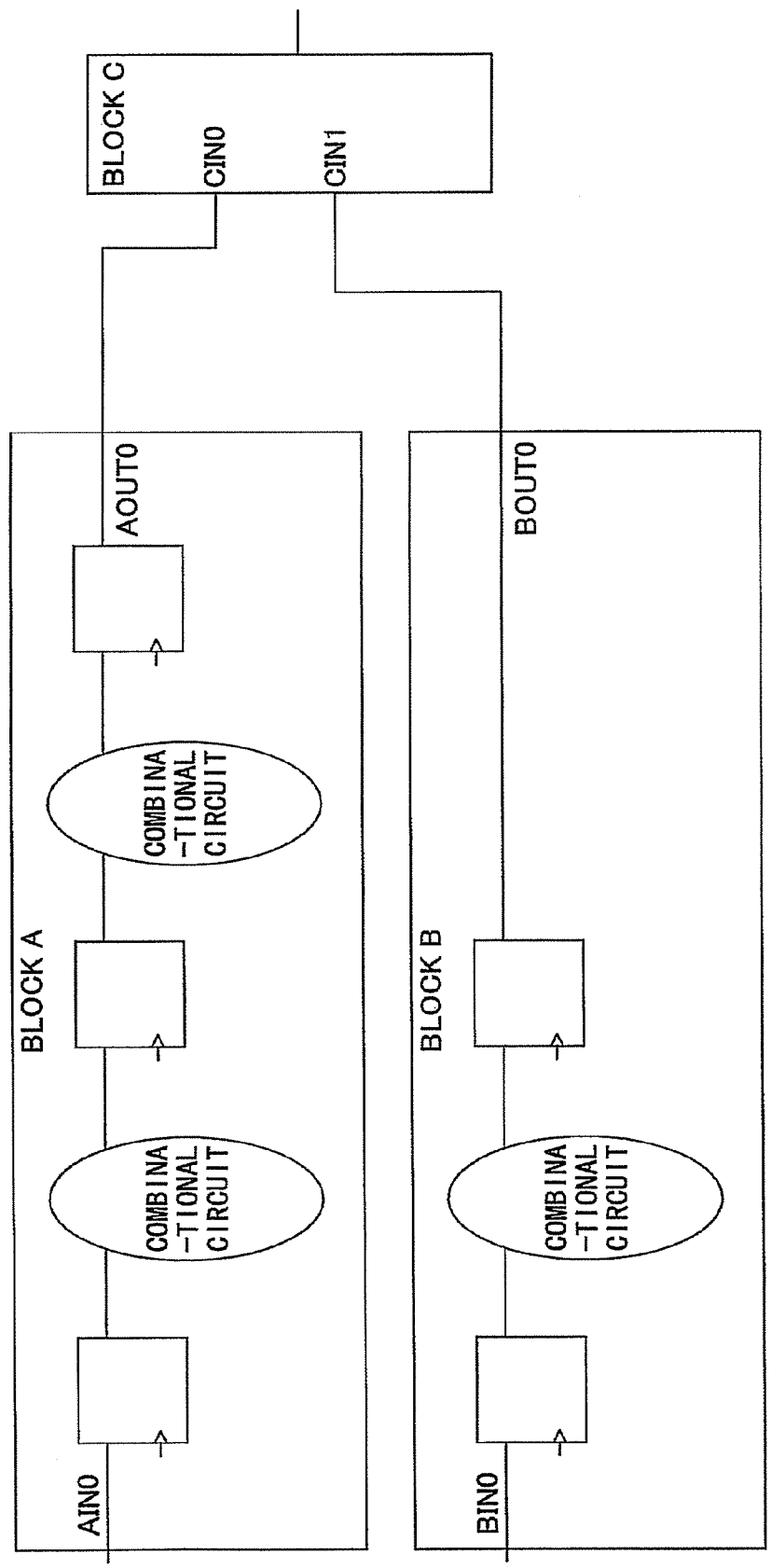
FIG. 1 is a first diagram illustrating conventional latency adjustment.
Figure 2:
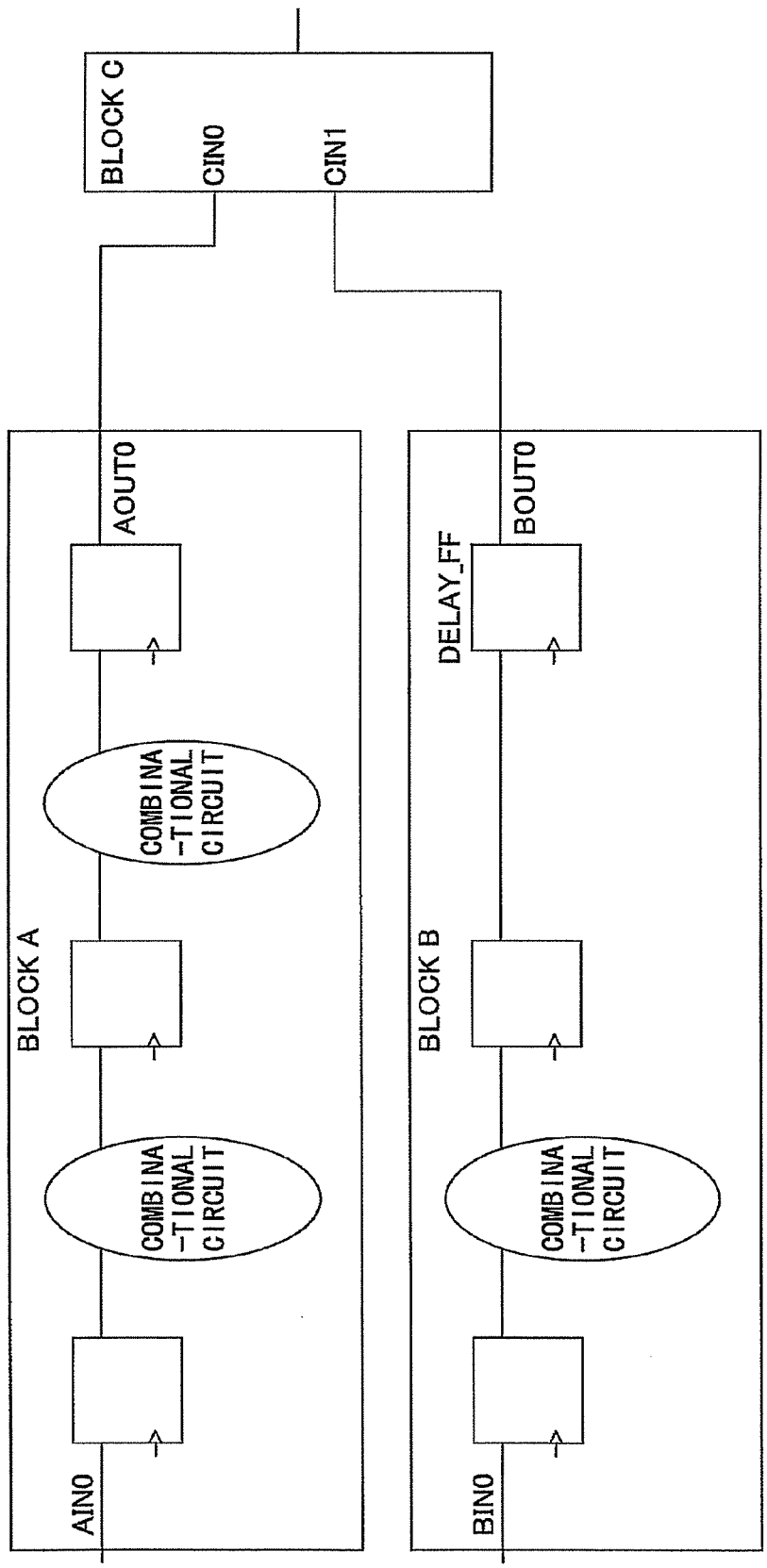
FIG. 2 is a second diagram illustrating conventional latency adjustment.
Figure 3:
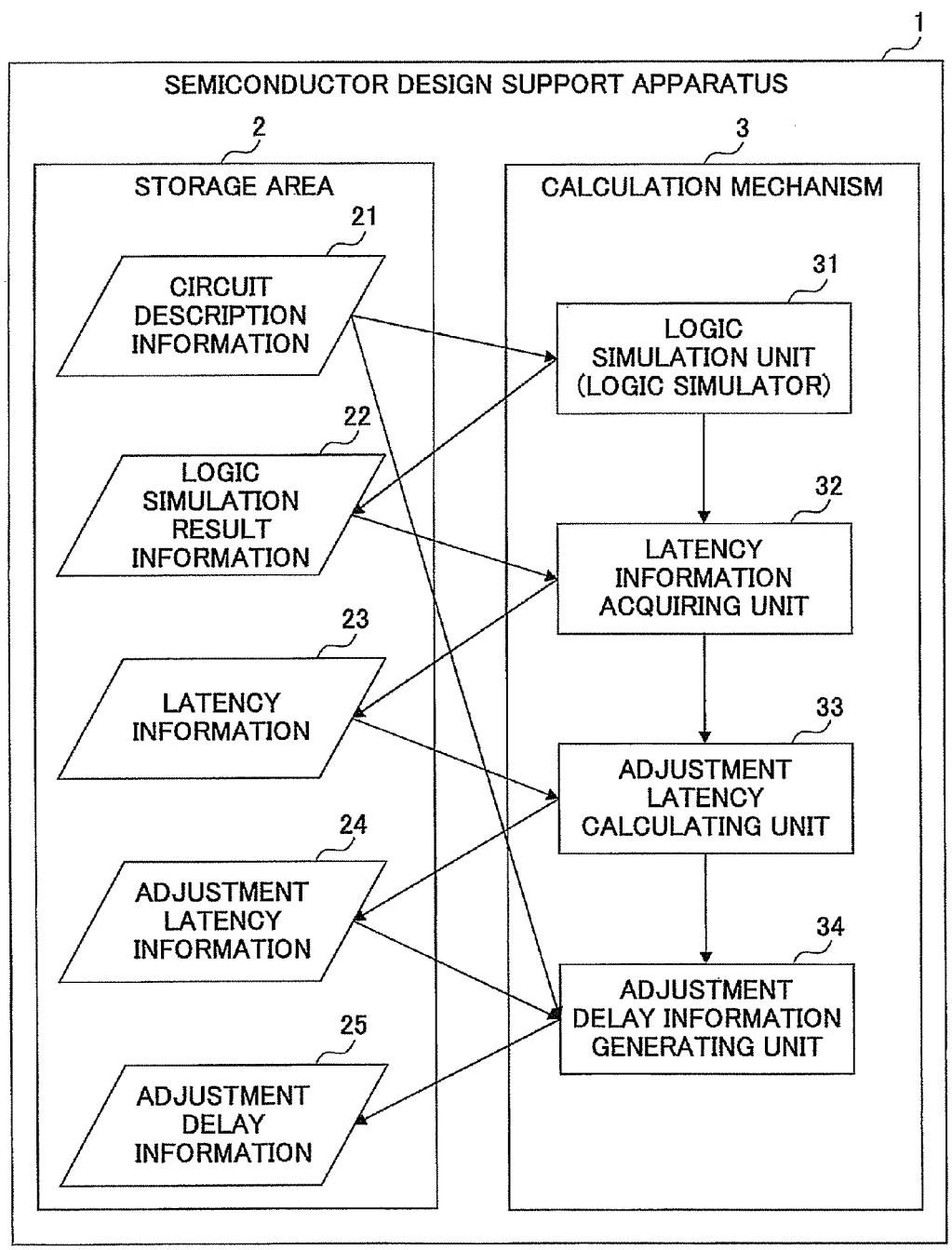
FIG. 3 shows a configuration example of a semiconductor design support apparatus according to a first embodiment of the present invention.

FIG. 3 shows a configuration example of a semiconductor design support apparatus 1 according to the first embodiment of the present invention.

In FIG. 3, the semiconductor design support apparatus 1 is constructed with a stand-alone computer system, or multiple computer systems connected via a network. A storage area 2 of the semiconductor design support apparatus 1 holds circuit description information 21, logic simulation result information 22, latency information 23, adjustment latency information 24 and adjustment delay information 25. In a calculation mechanism 3 of the semiconductor design support apparatus 1, a logic simulation unit (logic simulator) 31, a latency information acquiring unit 32, an adjustment latency calculating unit 33 and an adjustment delay information generating unit 34 are realized by the operation of a computer program.

The logic simulation unit 31 inputs the circuit description information 21 from the storage area 2, then performs logic simulation and outputs the logic simulation result information 22 to the storage area 2. Specific examples of the circuit description information 21 include circuit descriptions using hardware description languages, such as Verilog HDL and SystemC. In the present embodiment, an RTL (Register Transfer Level) description in Verilog HDL is used as a specific example of the circuit description information 21.

The logic simulation result information 22 includes information of signal names and signal values associated with times (clock cycle times). Note that instead of explicitly outputting the logic simulation result information 22 to the storage area 2, the succeeding latency information acquiring unit 32 may acquire necessary logic simulation result information from the logic simulation unit 31 using an API (Application Programming Interface) installed in the logic simulation unit 31. A specific API is, for example, "VPI (Verilog Procedural Interface)".

The logic simulation unit 31 usually applies a test pattern for verifying functions of the circuit to an external input of the circuit description. In the case of an RTL description, the external input is an externally input valid signal, and the logic simulation unit 31 performs logic simulation by applying a logical value "0" or "1" to the valid signal.

In the above test pattern, a valid signal inside the circuit is initialized to the logical value "0" at the start of the logic simulation, and the logical value "1" is applied to the externally input valid signal at a predetermined timing. Assume that, after the logical value "1" is applied to the externally input valid signal, the logical value of the internal valid signal changes to "1" during the logic simulation. In this case, the time of the logical value change indicates the time when data have arrived at the internal signal position. It is therefore possible to know latency from the difference between the arrival time and the time of the application of the logical value "1".

Figure 4:
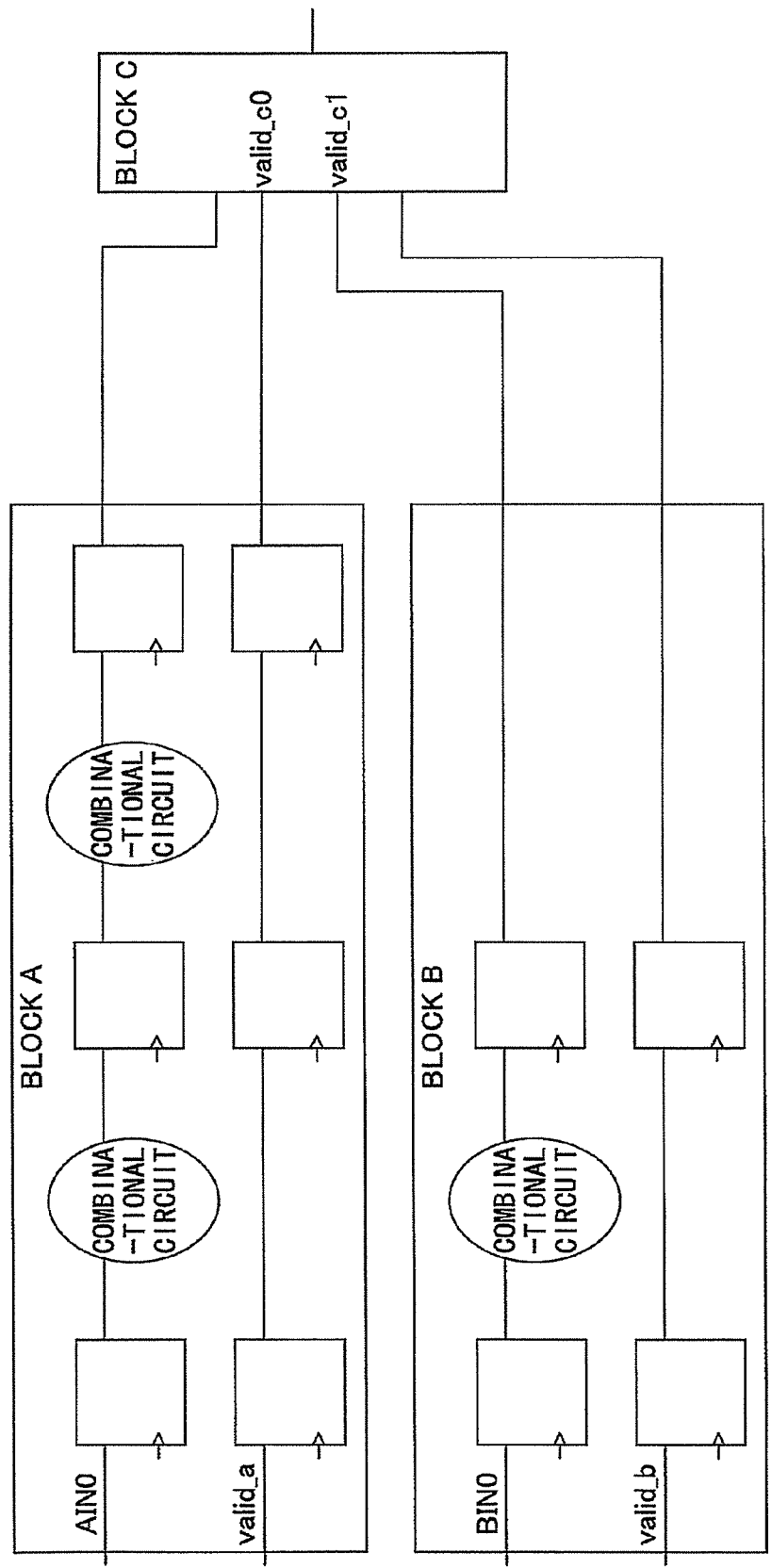
FIG. 4 shows an example of targeted circuit description information.

The valid signals are more specifically explained with reference to FIG. 4. FIG. 4 shows an example of the targeted circuit description information 21. In FIG. 4, valid_a and valid_b are externally input valid signals. On the other hand, valid_c0 and valid_c1 are internal valid signals. At the start of the logic simulation, valid_a, valid_b, valid_c0 and valid_c1 are initialized to the logical value "0" by the logic simulation unit 31. Subsequently, the logical value "1" is applied to the externally input valid_a and valid_b by the logic simulation unit 31. The application of the logical value "1" to the externally input valid_a and valid_b and the occurrence of the logical value "1" at the internal valid_c0 and valid_c1 are recorded in the logic simulation result information 22 together with the corresponding times.

Referring back to FIG. 3, the latency information acquiring unit 32 inputs the logic simulation result information 22 from the storage area 2, or acquires the logic simulation result information from the logic simulation unit 31 via the API. The latency information acquiring unit 32 then performs predetermined information extraction processing and outputs the latency information 23 to the storage area 2.

Assume here that the time when the logical value "1" is applied to the external signals valid_a and valid_b is "0", and that time "1" corresponds to 1 clock cycle. In this case, the logic simulation result information 22 based on the circuit description information 21 shown in FIG. 4 includes information indicating that valid_c0 changes to the logical value "1" at time "3" and valid_c1 changes to the logical value "1" at time "2". Accordingly, the latency information acquiring unit 32 acquires information indicating that the latency of valid_c0, i.e. the latency of Block A, is "3" and the latency of valid_c1, i.e. the latency of Block B, is "2", and then outputs the information to the storage area 2 as the latency information 23.

Referring back to FIG. 3, the adjustment latency calculating unit 33 inputs the latency information 23 from the storage area 2, then calculates the amount of delay to be added for latency adjustment, and outputs the adjustment latency information 24 to the storage area 2. That is, the adjustment latency calculating unit 33 calculates a difference in the latency of individual blocks at the internal signal junction, and outputs the difference as the adjustment latency information 24. The latency information 23 based on the circuit description information 21 of FIG. 4 includes the information indicating that the latency of valid_c0, i.e. the latency of Block A, is "3" and the latency of valid_c1, i.e. the latency of Block B, is "2". Accordingly, the adjustment latency calculating unit 33 calculates [the latency of Block A]−[the latency of Block B]=3−2=1, and outputs "1" as the adjustment latency information 24 for the signal junction.

Referring back to FIG. 3, the adjustment delay information generating unit 34 inputs the circuit description information 21 and the adjustment latency information 24 from the storage area 2, then generates delay information required for latency adjustment, and outputs the delay information to the storage area 2 as the adjustment delay information 25. The present embodiment uses an RTL description in Verilog HDL as an example of the circuit description information 21, and in this case, the adjustment delay information 25 is an RTL description to which a register description has been added. Note that instead of the entire RTL description to which a register description has been added, only the added register-description part may be output as the adjustment delay information 25.

The following procedures can be used to cause the signal arrival times of valid_c0 and valid_c1 to be the same based on the circuit description information 21 of FIG. 4: one register is added to Block B so that the latency of Block B becomes "3"; and conversely, one of the registers in Block A is deleted so that the latency of Block A becomes "2". Here is considered the case of adding a register to Block B.

Figure 5:
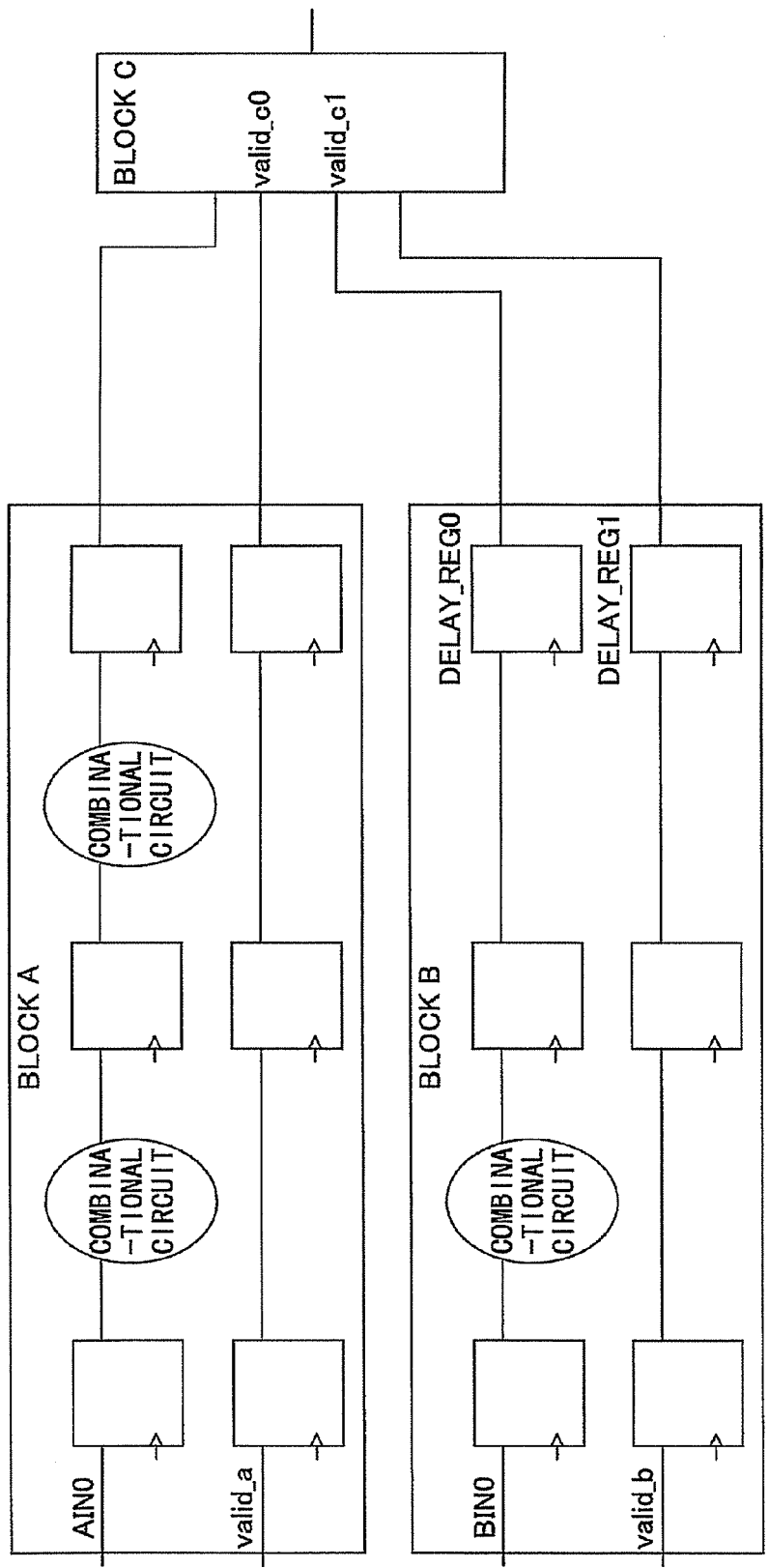
FIG. 5 shows an example of circuit description information into which registers have been inserted.
Figure 6:
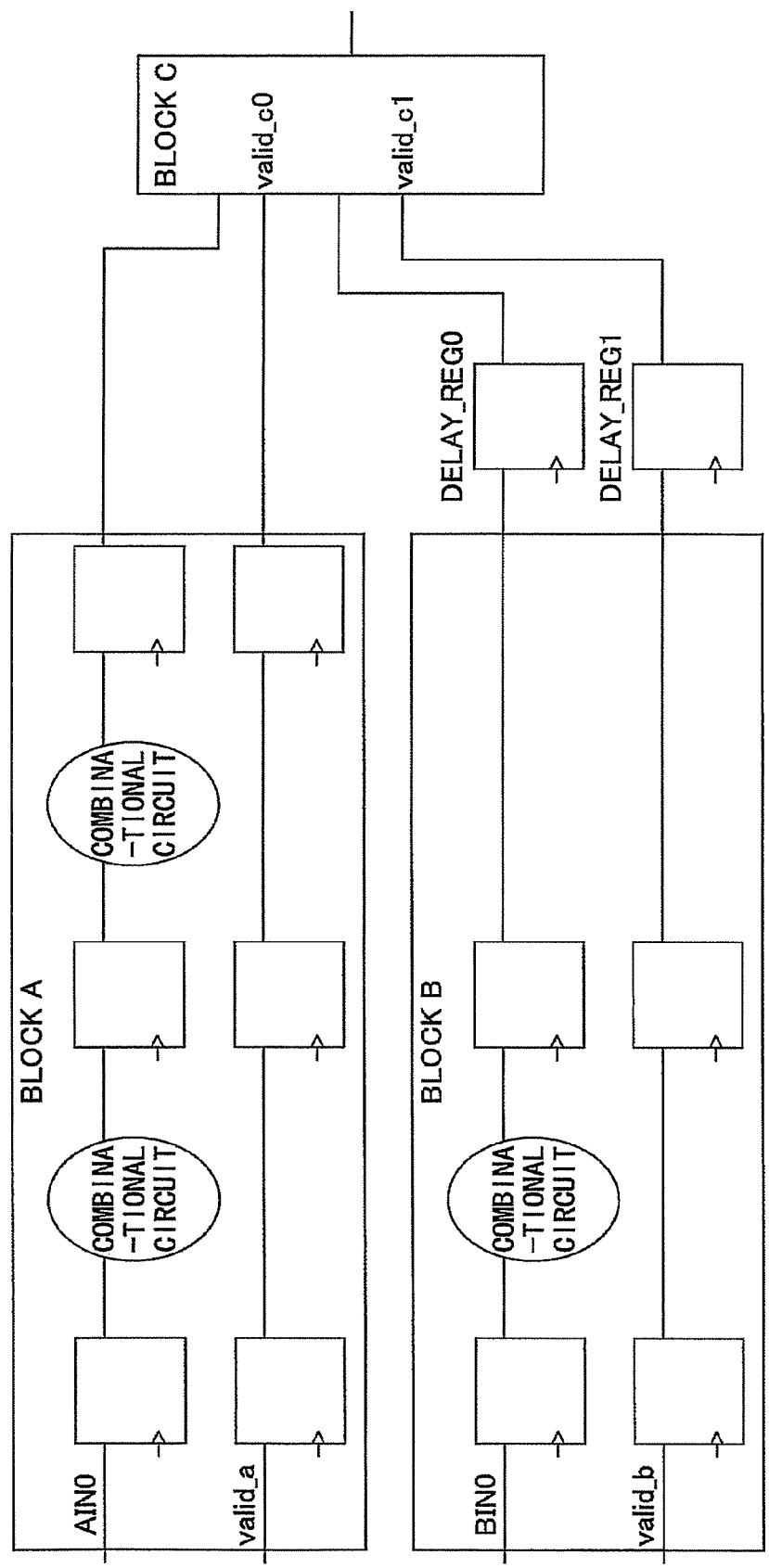
FIG. 6 shows an example of circuit description information into which registers have been provided outside a block.

The adjustment delay information generating unit 34 generates a circuit description in which, as shown in FIG. 5, a register DELAY_REG1 is added to Block B and a register DELAY_REG0 is also added to a data path through which a signal of the input BIN0 propagates, and outputs the circuit description to the storage area 2 as the adjustment delay information 25. Note that, in FIG. 5, the registers are added to the inside of Block B; however, the registers DELAY_REG0 and DELAY_REG1 may be added to the outside of Block B as shown in FIG. 6. This allows the latency to be adjusted without alteration of the existing Block B.

[Second Embodiment]

Figure 7:
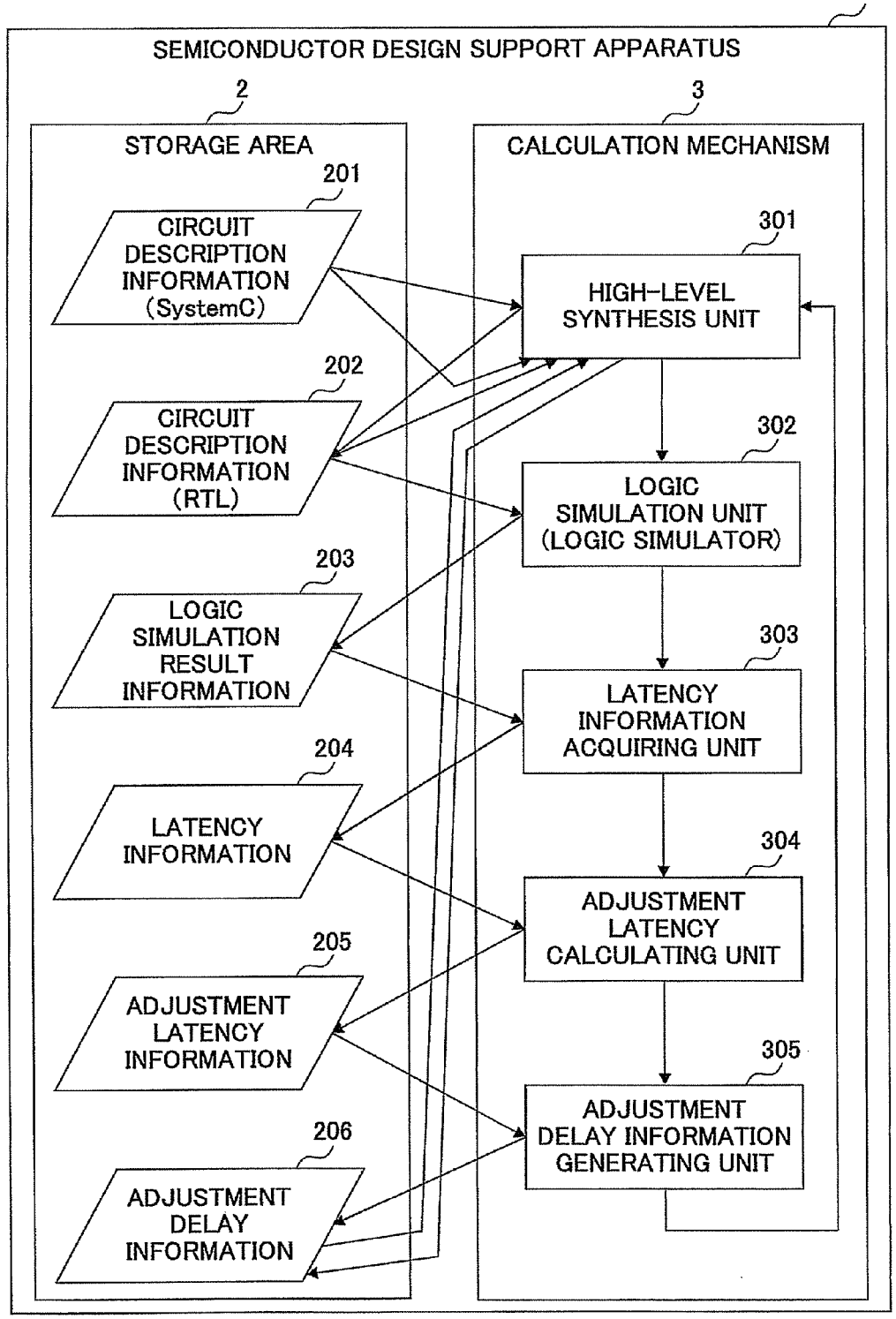
FIG. 7 shows a configuration example of a semiconductor design support apparatus according to a second embodiment of the present invention.

FIG. 7 shows a configuration example of the semiconductor design support apparatus 1 according to the second embodiment of the present invention.

In FIG. 7, the semiconductor design support apparatus 1 is constructed with a stand-alone computer system, or multiple computer systems connected via a network. The storage area 2 of the semiconductor design support apparatus 1 holds circuit description information 201, circuit description information 202, logic simulation result information 203, latency information 204, adjustment latency information 205 and adjustment delay information 206. In the calculation mechanism 3 of the semiconductor design support apparatus 1, a high-level synthesis unit 301, a logic simulation unit (logic simulator) 302, a latency information acquiring unit 303, an adjustment latency calculating unit 304 and an adjustment delay information generating unit 305 are realized by the operation of a computer program.

According to the above first embodiment, the processing is started with the circuit description information 21 that is an RTL description or the like; however, in the second embodiment, the processing is started with the circuit description information 201 which is, for example, a high-level circuit description in SystemC or the like.

Figure 8:
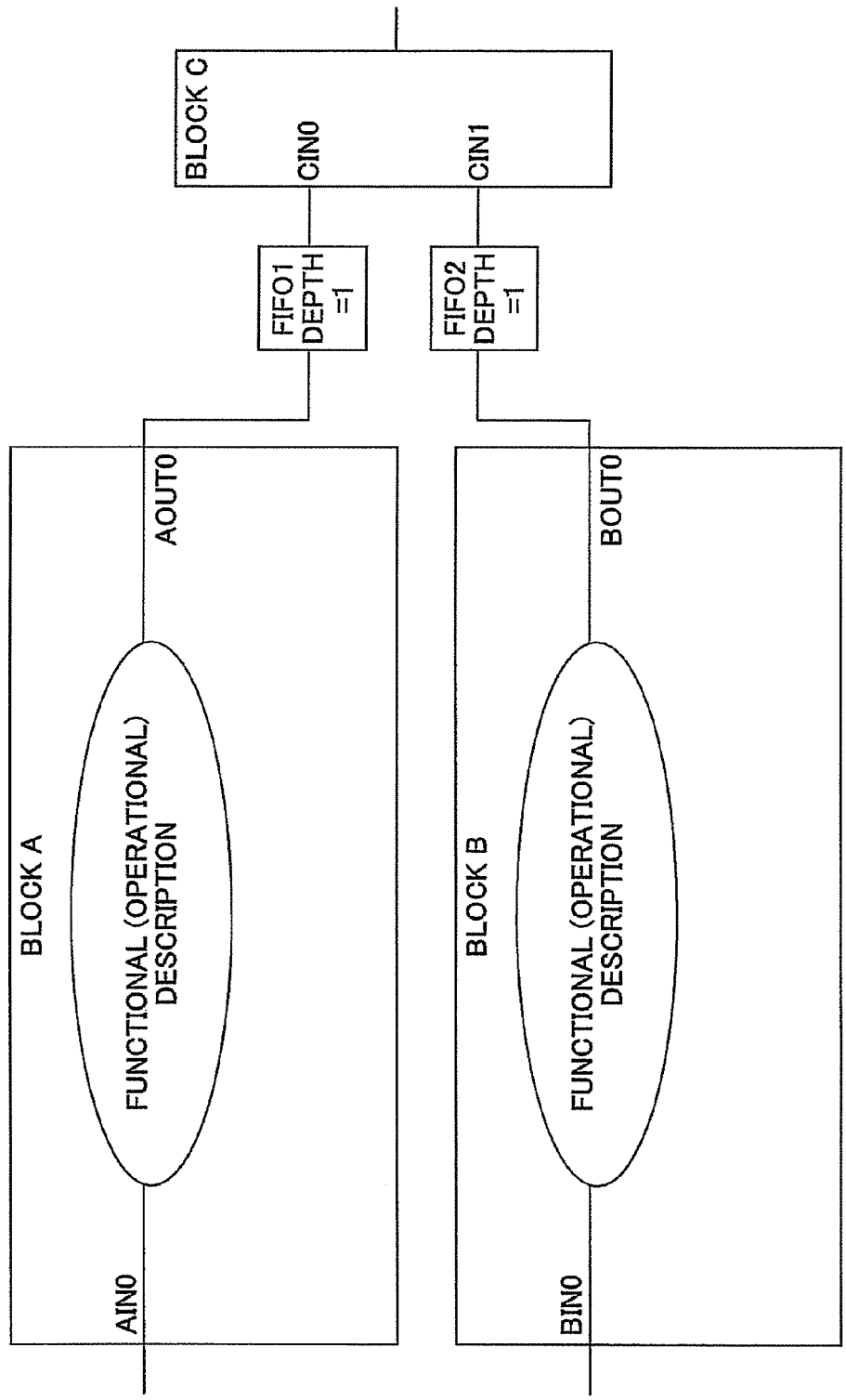
FIG. 8 shows an example of targeted circuit description information.

As preprocessing, FIFOs (First-In First-Out) with a depth of "1" are placed, within the circuit description information 201, at parts requiring latency adjustment. This placement is handled by the user of the semiconductor design support apparatus 1. FIG. 8 shows, as the circuit description information 201, a concept of a high-level description in which FIFO1 and FIFO2 are placed. FIG. 9 shows an example of a description in SystemC. According to FIG. 9, under SC_MODULE (TOP), the placement of FIFO1 and FIFO2 and connections of Blocks A, B and C to respective signals are described. DEPTH1 and DEPTH2 indicate depths of FIFO1 and FIFO2, respectively, and the user is allowed to designate specific values for these depths. Assume here that both DEPTH1 and DEPTH 2 are set to "1" at first.

Referring back to FIG. 7, the high-level synthesis unit 301 inputs the circuit description information 201 from the storage area 2, then performs high-level synthesis based on a functional (operational) description included in the circuit description information 201, and outputs the circuit description information 202 to the storage area 2. As the circuit description information 202, an RTL description or the like in Verilog HDL is assumed. The FIFOs with a depth of "1" are preliminarily placed here; however, FIFOs with a depth of "0" may be placed (described) if allowed grammatically.

Figure 10:
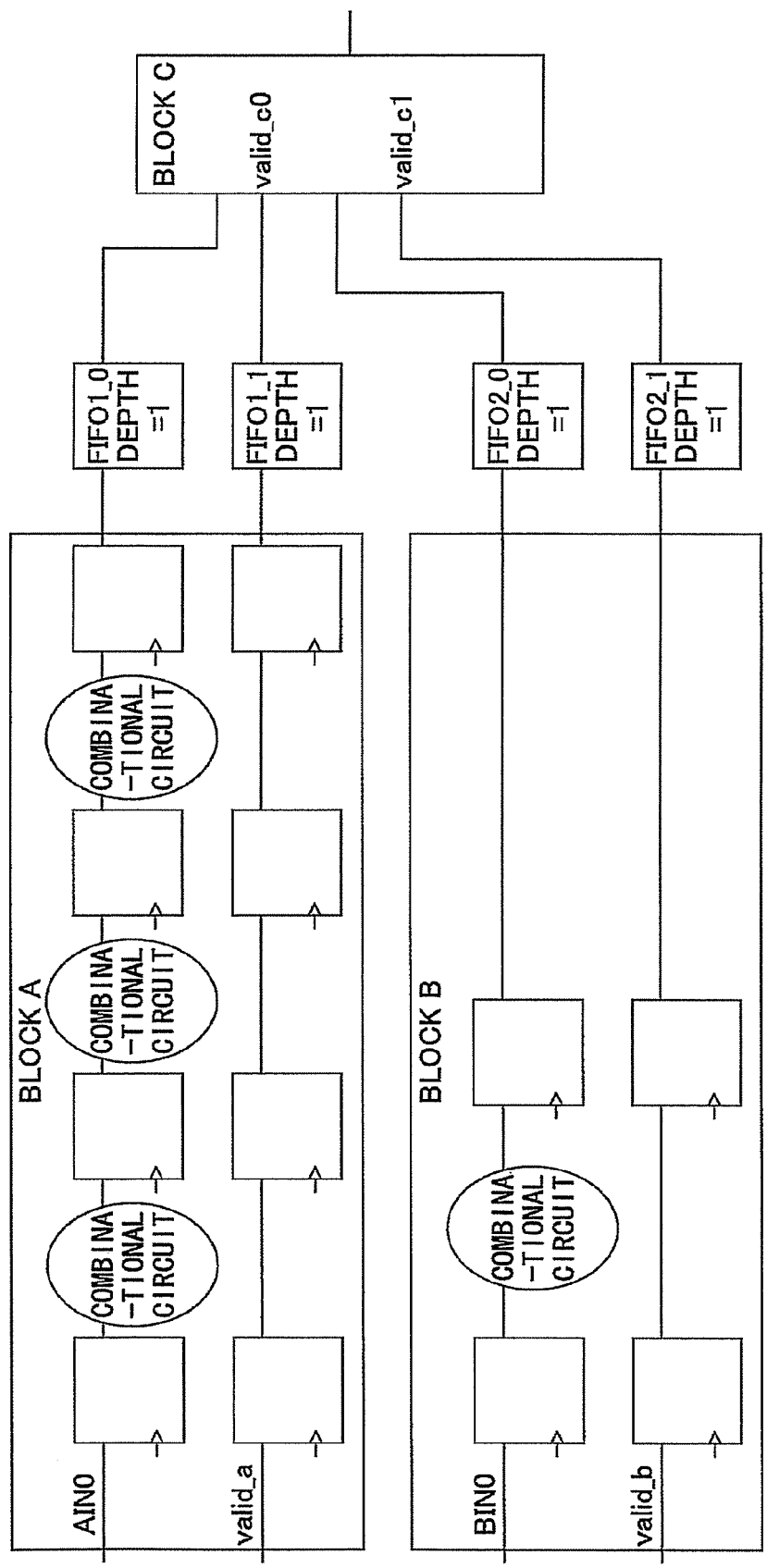
FIG. 10 shows an example of RTL generated by a high-level synthesis process.

FIG. 10 shows the circuit description information 202, which is an RTL description or the like produced by a high-level synthesis process using the circuit description information 201 of FIG. 8. Note that high-level synthesis is performed individually on Block A and Block B. In the case where blocks are large in scale and therefore high-level synthesis cannot be performed at once, it is just conceivable that high-level synthesis is performed on each block. When the high-level synthesis process is performed, FIFOs with a depth of "1" (FIFO1_0, FIFO1_1, FIFO2_0 and FIFO2_1) are generated in the RTL description for the FIFOs in the circuit description information 201.

Referring back to FIG. 7, the logic simulation unit 302 inputs the circuit description information 202 from the storage area 2, then performs logic simulation and outputs the logic simulation result information 203 to the storage area 2. The logic simulation result information 203 includes information of signal names and signal values associated with times (clock cycle times). Note that instead of explicitly outputting the logic simulation result information 203 to the storage area 2, the succeeding latency information acquiring unit 303 may acquire necessary logic simulation result information from the logic simulation unit 302 using an API installed in the logic simulation unit 302.

In order that latency of each block can be determined at following functional units, the logic simulation unit 302 initializes valid signals inside the circuit to the logical value "0" at the start of the logic simulation, and applies the logical value "1" to externally input valid signals at a predetermined timing. In the case of the circuit description information 202 of FIG. 10, valid_a, valid_b, valid_c0, valid_c1 and the like are initialized to the logical value "0" by the logic simulation unit 302 at the start of the logic simulation. Subsequently, the logical value "1" is applied to the externally input valid_a and valid_b by the logic simulation unit 302. The application of the logical value "1" to the externally input valid_a and valid_b and the occurrence of the logical value "1" at the internal valid_c0 and valid_c1 are recorded in the logic simulation result information 203 together with the corresponding times.

Referring back to FIG. 7, the latency information acquiring unit 303 inputs the logic simulation result information 203 from the storage area 2, or acquires the logic simulation result information from the logic simulation unit 302 via the API. The latency information acquiring unit 303 then performs predetermined information extraction processing and outputs the latency information 204 to the storage area 2.

Assume here that the time when the logical value "1" is applied to the external signals valid_a and valid_b is "0", and that time "1" corresponds to 1 clock cycle. In this case, the logic simulation result information 203 based on the circuit description information 202 shown in FIG. 10 includes information indicating that valid_c0 changes to the logical value "1" at time "5" and valid_c1 changes to the logical value "1" at time "3". Accordingly, the latency information acquiring unit 303 acquires information indicating that the latency of valid_c0 is "5" (the latency of Block A is "4") and the latency of valid_c1 is "3" (the latency of Block B is "2"), and then outputs the information to the storage area 2 as the latency information 204.

Referring back to FIG. 7, the adjustment latency calculating unit 304 inputs the latency information 204 from the storage area 2, then calculates the amount of delay to be added for latency adjustment, and outputs the adjustment latency information 205 to the storage area 2. That is, the adjustment latency calculating unit 304 calculates a difference in the signal latency at the internal signal junction, and outputs the difference as the adjustment latency information 205. The latency information 204 based on the circuit description information 202 of FIG. 10 includes the information indicating that the latency of valid_c0 is "5" and the latency of valid_c1 is "3". Accordingly, the adjustment latency calculating unit 304 calculates [the latency of valid_c0]−[the latency of valid_c1]=5−3=2, and outputs "2" as the adjustment latency information 205 for the signal junction.

Referring back to FIG. 7, the adjustment delay information generating unit 305 inputs the adjustment latency information 205 from the storage area 2, then generates depth information required for latency adjustment, and outputs the depth information to the storage area 2 as the adjustment delay information 206.

Figure 11:
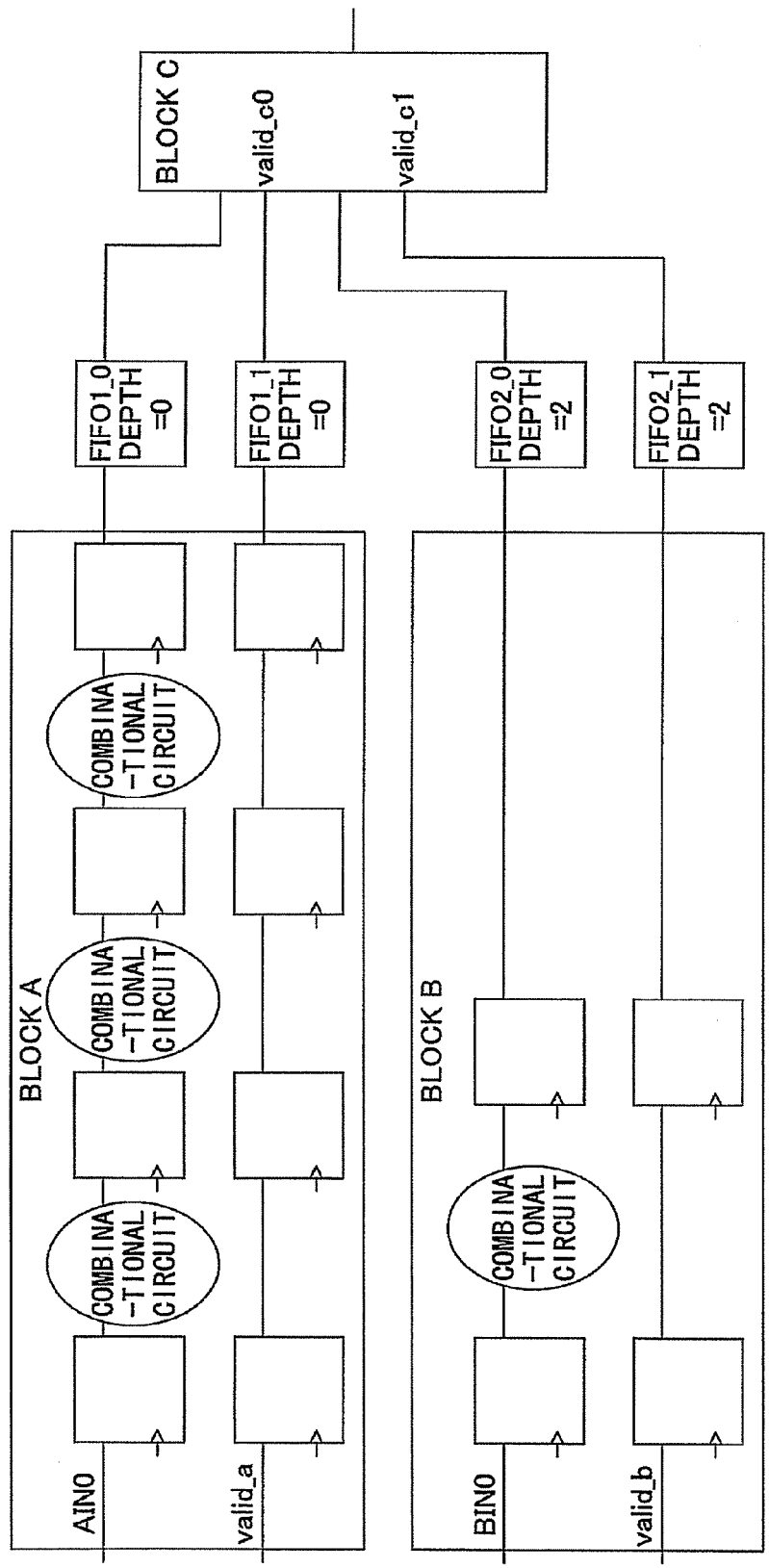
FIG. 11 shows that depths of FIFOs have been adjusted.

In the case when the logic simulation is performed based on the circuit description information 202 of FIG. 10, the adjustment delay information generating unit 305 specifies the depths of FIFO1_0 and FIFO1_1 belonging to the paths with longer latency to be "0" and the depths of FIFO2_0 and FIFO2_1 belonging to the paths with shorter latency to be "2" which corresponds to the difference in arrival times of valid_c0 and valid_c1. In this case, a circuit description after the adjustment is shown in FIG. 11. At the condition before the adjustment, as shown in FIG. 10, data arrive at valid_c1 at time "3". However, since data have yet to arrive at valid_c0 at time "3", Block C cannot make a calculation using the data having already arrived at valid_c1 and therefore cannot take in the data from Block B at time "4". The data not taken in are stored in FIFO2_0 and FIFO2_1. In FIG. 11, when data arrive at valid_c0 of Block C at time "4", Block C starts a calculation. After this point, data arrive at valid_c0 and valid_c1 each cycle, and thus latency adjustment is achieved. Note that information indicating that FIFO1_0 and the like are FIFOs for delay adjustment can be determined by setting rules or the like to include names of registers, e.g., a character string of "FIFO", in the RTL description.

Figure 12:
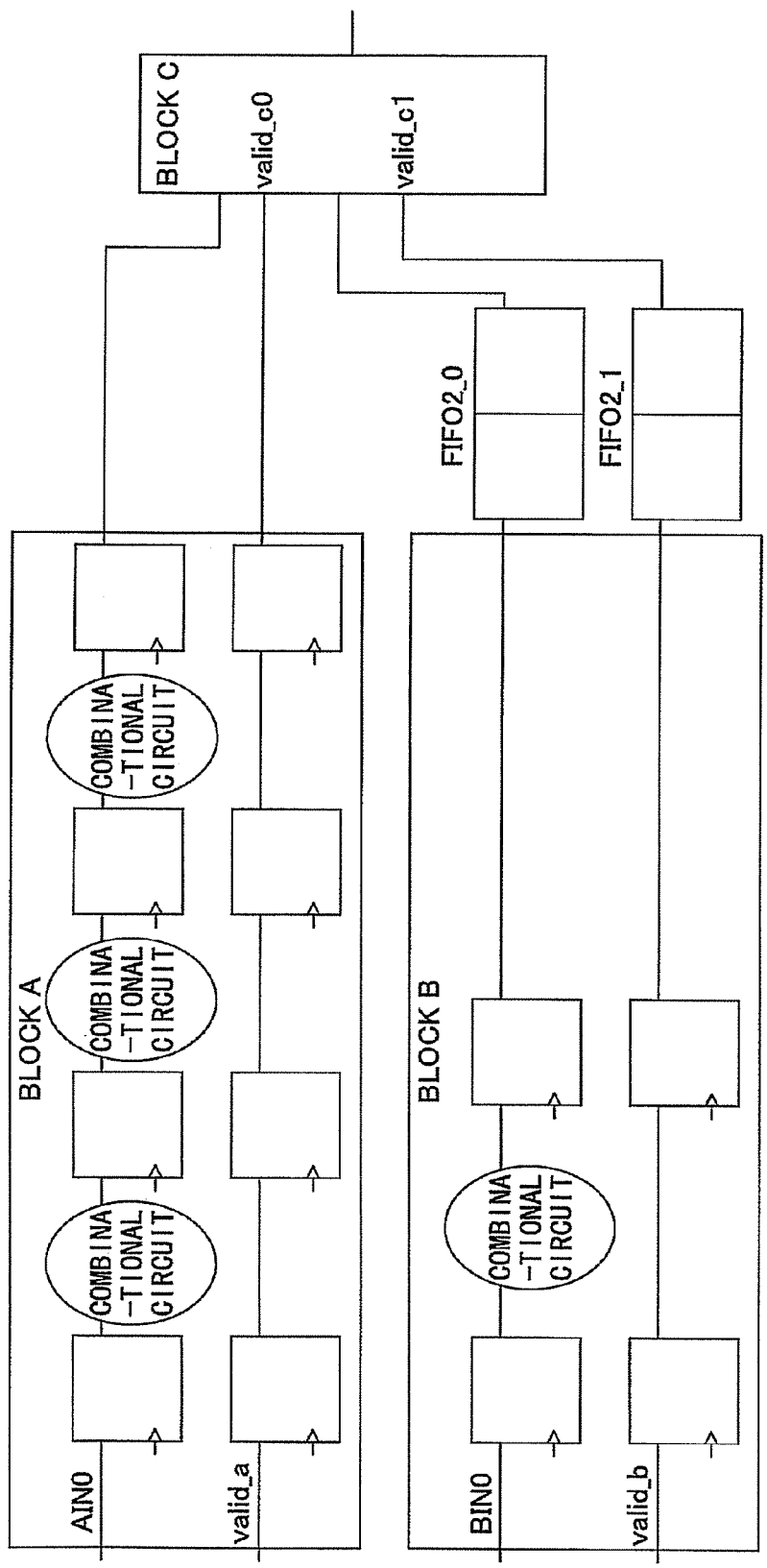
FIG. 12 shows an example of RTL generated by a second round of high-level synthesis.

Referring back to FIG. 7, the high-level synthesis unit 301 inputs the circuit description information 201, the circuit description information 202 and the adjustment delay information 206 from the storage area 2, then performs once again high-level synthesis using FIFO depth information included in the adjustment delay information 206, and outputs the result of the high-level synthesis to the adjustment delay information 206. The term "FIFO depth information" here is information indicating that the depth of FIFO1 and FIFO2 of the circuit description information 201 as shown in FIG. 8 is to be changed to "0" and "2", respectively. In other words, the information indicates that the values of DEPTH1 and DEPTH2 of FIG. 9 are "0" and "2", respectively. Note however that, in this repeated round, high-level synthesis is not performed on Block A and Block B, but performed only on FIFO1 and FIFO2 shown in FIG. 8. For Block A and Block B, the circuit description information 202, which is an RTL description obtained as a result of the first round of high-level synthesis, is reused. FIG. 12 shows the adjustment delay information 206 which is an RTL description obtained as a result of the second round of high-level synthesis. In FIG. 12, FIFOs whose depths have been changed to "0" (i.e. FIFO1_0 and FIFO1_1) have been deleted. Note that, instead of repeating high-level synthesis, FIFOs with a depth of "0" may be deleted by scanning the circuit description for such FIFOs.

[Modification]

If the above described first and second embodiments are applied, for example, to an image forming apparatus, the amount of delay to be added for latency adjustment may become significantly large, possibly corresponding to multiple lines of image data. In this case, delay circuits realized by a RAM (Random Access Memory) may be used instead of registers (flip-flops).

[General Overview]

The embodiments explained above offer the following advantages.

(1) Latency is calculated not by conventional visual inspection but using a logic simulator, and therefore accurate latency calculation is performed.

(2) Latency is calculated by not a high-level synthesis apparatus but a logic simulator, and therefore latency calculation can be performed for a circuit description which cannot be input to a high-level synthesis apparatus.

(3) In the case of embedding parts requiring latency adjustment in a circuit description, there is no need to provide a new information medium for specifying the parts requiring latency adjustment.

(4) Since information on the amount of delay required for latency adjustment is generated, latency can be adjusted by performing once again high-level synthesis using the information.

According to the embodiments of the present invention, a unit for calculating a difference in data arrival times is provided to a logic simulator, instead of being provided to such a high-level synthesis apparatus disclosed in Patent Document 1. The present invention is therefore capable of applying latency adjustment also to blocks designed by existing design technology which is not high-level design technology.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor design support apparatus that reads circuit description in a hardware description language and generates information required for delay adjustment, the semiconductor design support apparatus comprising:
    a logic simulation unit configured to perform logic simulation based on the circuit description in the hardware description language and output logic simulation result information;
    a latency information acquiring unit configured to acquire, from the logic simulation result information, latency information relating to signals at a signal junction, the signals being output from a plurality of blocks;
    an adjustment latency calculating unit configured to calculate, from the latency information, adjustment latency information required for the delay adjustment; and
    an adjustment delay information generating unit configured to generate, from the adjustment latency information, adjustment delay information required for the delay adjustment, wherein
    the adjustment delay information generating unit is configured to modify a description in the hardware description language of a block having small latency in the circuit description in the hardware description language, by adding a delay amount to a description in the hardware description language of a delay circuit corresponding to a difference in signal latency of the blocks at the signal junction, and outputs the modified circuit description in the hardware description language as the adjustment delay information, and wherein
    the description in the hardware description language of the delay in the modified circuit description in the hardware description language includes a name of at least one delay element.

2. The semiconductor design support apparatus as claimed in claim 1, wherein the logic simulation unit records, in the logic simulation result information, a change in a signal value at each part in a circuit in association with a time of the change.

3. The semiconductor design support apparatus as claimed in claim 1, wherein the latency information acquiring unit acquires, from the logic simulation result information, signal latency of the blocks at the signal junction and outputs the signal latency as the latency information.

4. The semiconductor design support apparatus as claimed in claim 1, wherein the adjustment latency calculating unit calculates, from the latency information, a difference in signal latency of the blocks at the signal junction and outputs the difference as the adjustment latency information.

5. The semiconductor design support apparatus as claimed in claim 1, wherein in the circuit description in the hardware description language, a description in the hardware description language of delay circuits is preliminarily provided at a part requiring the delay adjustment, and the adjustment delay information generating unit sets, to "0", latency of a delay circuit provided for a block having large latency and sets latency of a delay circuit provided for a block having small latency to a difference in signal latency of the blocks at the signal junction, the difference being indicated by the adjustment latency information.

6. The semiconductor design support apparatus as claimed in claim 1, further comprising a circuit generating unit configured to generate a latency-adjusted lower-level circuit from the read circuit description in the hardware description language which is a high-level circuit description in the hardware description language and the generated adjustment delay information.

7. A semiconductor design support apparatus that reads circuit description in a hardware description language and generates information required for delay adjustment, the semiconductor design support apparatus comprising:
    a logic simulation unit configured to perform logic simulation based on the circuit description in the hardware description language and output logic simulation result information;
    a latency information acquiring unit configured to acquire, from the logic simulation result information, latency information relating to signals at a signal junction, the signals being output from a plurality of blocks;
    an adjustment latency calculating unit configured to calculate, from the latency information, adjustment latency information required for the delay adjustment; and
    an adjustment delay information generating unit configured to generate, from the adjustment latency information, adjustment delay information required for the delay adjustment,
    wherein the adjustment delay information generating unit modifies a description in the hardware description language of a block having large latency in the circuit description in the hardware description language, by reducing a delay amount in a description in the hardware description language of a delay circuit corresponding to a difference in signal latency of the blocks at the signal junction and outputs the modified description in the hardware description language of the delay circuit as the adjustment delay information, the difference being indicated by the adjustment latency information, and wherein
    the description in the hardware description language of the delay circuit includes a name of at least one delay element.

8. A semiconductor design support control method applied to a semiconductor design support apparatus that reads circuit description in a hardware description language and generates information required for delay adjustment, the semiconductor design support control method comprising:
    a logic simulation step of performing logic simulation, by a computer, based on the circuit description in the hardware description language and outputting logic simulation result information;
    a latency information acquiring step of acquiring, from the logic simulation result information, latency information relating to signals at a signal junction, the signals being output from a plurality of blocks;
    an adjustment latency calculating step of calculating, from the latency information, adjustment latency information required for the delay adjustment; and
    an adjustment delay information generating step of generating, from the adjustment latency information, adjustment delay information required for the delay adjustment, wherein
    the adjustment delay information generating step includes modifying a description in the hardware description language of a block having small latency in the circuit description in the hardware description language by adding a delay amount to a description in the hardware description language of a delay circuit corresponding to a difference in signal latency of the blocks at the signal junction, and outputs the modified circuit description in the hardware description language as the adjustment delay information, and wherein the description in the hardware description language of the delay circuit in the modified circuit description in the hardware description language includes a name of at least one delay element.

\* \* \* \* \*